US009478701B2

(12) United States Patent
Yang et al.

(10) Patent No.: US 9,478,701 B2
(45) Date of Patent: Oct. 25, 2016

(54) MULTI-SECTION ROD SEMICONDUCTOR LIGHT-EMITTING DEVICE AND MANUFACTURING METHOD THEREOF

(71) Applicant: National Taiwan University, Taipei (TW)

(72) Inventors: Chih-Chung Yang, Taipei (TW); Che-Hao Liao, Taipei (TW); Charng-Gan Tu, Taipei (TW); Horng-Shyang Chen, Taipei (TW); Chia-Ying Su, Taipei (TW)

(73) Assignee: National Taiwan University, Taipei (TW)

( * ) Notice: Subject to any disclaimer, the term of this patent is extended or adjusted under 35 U.S.C. 154(b) by 100 days.

(21) Appl. No.: 14/265,360

(22) Filed: Apr. 30, 2014

(65) Prior Publication Data

US 2015/0263227 A1 Sep. 17, 2015

(30) Foreign Application Priority Data

Mar. 11, 2014 (TW) .............................. 103108403 A

(51) Int. Cl.
| | |
|---|---|
| *H01L 33/24* | (2010.01) |
| *H01L 33/08* | (2010.01) |
| *H01L 27/15* | (2006.01) |
| *H01L 33/00* | (2010.01) |
| *H01L 33/20* | (2010.01) |

(52) U.S. Cl.
CPC ............ *H01L 33/08* (2013.01); *H01L 27/153* (2013.01); *H01L 33/24* (2013.01); *H01L 33/007* (2013.01); *H01L 33/0075* (2013.01); *H01L 33/20* (2013.01)

(58) Field of Classification Search
CPC ............................... H01L 33/08; H01L 33/24
See application file for complete search history.

(56) References Cited

U.S. PATENT DOCUMENTS

| | | | | |
|---|---|---|---|---|
| 8,455,284 | B2 * | 6/2013 | Seong | ............... H01L 33/32 257/13 |
| 2008/0035951 | A1 * | 2/2008 | Park | .............. C30B 25/02 257/103 |
| 2011/0095324 | A1 | 4/2011 | Wang et al. | |
| 2012/0056237 | A1 * | 3/2012 | Choi | ............ H01L 21/02422 257/103 |
| 2013/0161584 | A1 | 6/2013 | Crowder et al. | |
| 2015/0340552 | A1 * | 11/2015 | Amstatt | ............. H01L 33/08 257/13 |
| 2015/0364642 | A1 * | 12/2015 | Cha | ............. H01L 33/0075 438/35 |

* cited by examiner

FOREIGN PATENT DOCUMENTS

KR 20100082215 A * 7/2010 ............. H01L 33/06

OTHER PUBLICATIONS

English translation of KR20100082215 provided by KPION, Jul. 16, 2010.*

*Primary Examiner* — Mohsen Ahmadi
*Assistant Examiner* — Stephen Bradley
(74) *Attorney, Agent, or Firm* — Jianq Chyun IP Office

(57) ABSTRACT

A semiconductor light-emitting device including a substrate, a first-type doped semiconductor structure, a light-emitting layer, and a second-type doped semiconductor layer is provided. The first-type doped semiconductor structure is located on the substrate and includes a base and multi-section rod structures extended upward from the base. Each multi-section rod structure includes rods and at least one connecting portion. The connecting portion connects adjacent rods along a first direction, wherein the first direction is perpendicular to the base and points to the connecting portion from the base. Cross-section areas of different rods on a reference plane parallel to the substrate are different, and cross-section areas of the connecting portion on the reference plane decrease along the first direction. The light-emitting layer is located on sidewalls of the rods. The second-type doped semiconductor layer is located on the light-emitting layer. A manufacturing method of the semiconductor light-emitting device is also provided.

11 Claims, 8 Drawing Sheets

MULTI-SECTION ROD SEMICONDUCTOR LIGHT-EMITTING DEVICE AND MANUFACTURING METHOD THEREOF

CROSS-REFERENCE TO RELATED APPLICATION

This application claims the priority benefit of Taiwan application serial no. 103108403, filed on Mar. 11, 2014. The entirety of the above-mentioned patent application is hereby incorporated by reference herein and made a part of this specification.

BACKGROUND OF THE INVENTION

1. Field of the Invention

The invention relates to a semiconductor device and a manufacturing method thereof. More particularly, the invention relates to a semiconductor light-emitting device and a manufacturing method thereof.

2. Description of Related Art

With advances in optical technology, the manufacture and the application of a semiconductor light-emitting device such as a light-emitting diode are becoming more developed. Due to advantages such as low pollution, low power consumption, and long service life, the light-emitting diode is widely applied in various light sources or illumination such as traffic signals, outdoor billboards, and display backlights, and has become an important part in the optoelectronics industry.

However, monolithic micro-displays have always faced the technical bottleneck of colorization. The prior art mainly uses a light-emitting diode with different color light conversion materials (such as fluorescent powders) to convert the original light color of the light-emitting diode to other light colors (i.e., converting to light of other wave bands), thereby generating white light after lights of different wave bands are mixed. However, the current color light conversion materials have issues such as very low conversion efficiency and coating uniformity, and therefore the technique has the issue of poor color rendering index (CRI).

Moreover, another technique purposes the manufacture of a plurality of light-emitting layers (including red, green, and blue light-emitting layers) having different materials on a substrate with an epitaxy technique such that a single light-emitting diode provides different light colors. However, since the materials of the red, green, and blue light-emitting layers are different, and lattice constants of different materials are also different, the technique has the issues of complex manufacture, high costs, and poor reliability (such as readily cracked or having many defects).

Moreover, a transfer technique of an epitaxy film layer of a light-emitting diode transfers light-emitting diodes of different light colors to the same target substrate from the growth substrates thereof, thereby obtaining a colored array structure. However, during the transfer process of the epitaxy film layer of the light-emitting diode, the issue of deformation of a conductive bump caused by touching and squeezing between the light-emitting diodes transferred from the growth substrates and the conductive bump of the corresponding location on the target substrate readily occurs, thus causing difficulty in a subsequent transfer and a reliability issue after the transfer. Therefore, how to provide a light-emitting diode having good reliability and CRI is one of the current issues researchers urgently need to solve.

SUMMARY OF THE INVENTION

The invention provides a manufacturing method of a semiconductor light-emitting device. The method can manufacture a semiconductor light-emitting device having good reliability and CRI.

The invention provides a semiconductor light-emitting device. The semiconductor light-emitting device has good reliability and CRI.

A manufacturing method of a semiconductor light-emitting device of the invention includes the following steps. First, a first-type doped semiconductor structure is formed on a substrate. The first-type doped semiconductor structure includes a base and a plurality of multi-section rod structures extended upward from the base. Each multi-section rod structure includes a plurality of rods and at least one connecting portion. The connecting portion connects adjacent rods along a first direction, wherein the first direction is perpendicular to the base and points to the connecting portion from the base. Cross-section areas of different rods on a reference plane parallel to the substrate are different, and cross-section areas of the connecting portion on the reference plane decrease along the first direction. Then, a light-emitting layer is formed on sidewalls of the rods. Next, a second-type doped semiconductor layer is formed on the light-emitting layer.

A semiconductor light-emitting device of the invention includes a substrate, a first-type doped semiconductor structure, a light-emitting layer, and a second-type doped semiconductor layer. The first-type doped semiconductor structure is located on the substrate and includes a base and a plurality of multi-section rod structures extended upward from the base. Each multi-section rod structure includes a plurality of rods and at least one connecting portion. The connecting portion connects adjacent rods along a first direction, wherein the first direction is perpendicular to the base and points to the connecting portion from the base. Cross-section areas of different rods on a reference plane parallel to the substrate are different, and cross-section areas of the connecting portion on the reference plane decrease along the first direction. The light-emitting layer is located on sidewalls of the rods. The second-type doped semiconductor layer is located on the light-emitting layer.

A semiconductor light-emitting device of the invention includes a substrate, a base, a plurality of multi-section rod structures, and a second-type doped semiconductor layer. The base is located on the substrate. The multi-section rod structures are respectively extended upward from the base. Each multi-section rod structure includes a plurality of rods and at least one connecting portion. The connecting portion connects adjacent rods along a first direction, wherein the first direction is perpendicular to the base and points to the connecting portion from the base. Cross-section areas of different rods on a reference plane parallel to the substrate are different, and cross-section areas of the connecting portion on the reference plane decrease along the first direction. Each rod includes at least one first-type doped semiconductor layer, a light-emitting layer, and a second-type doped semiconductor layer. The light-emitting layer is located between the first-type doped semiconductor layer and the second-type doped semiconductor layer.

Based on the above, in the manufacturing method of a semiconductor light-emitting device of the embodiments of the invention, the light-emitting layer is formed on the multi-section rod structures. Since the material composition of the light-emitting layer formed on different rods varies with the cross-section area of the rod, the light-emitting layers corresponding to different rods can emit light colors of different wave bands. Therefore, by modulating the cross-section area of each rod, the semiconductor light-emitting device of the embodiments of the invention can emit different light colors at the same time, wherein when combined, the entire semiconductor light-emitting device has good CRI. Moreover, since in the embodiments of the invention, different light colors can be obtained by changing the cross-section areas of the rods and different light colors do not need to be obtained by stacking different materials, the known issue of cracks and defects caused by different lattice constants when a plurality of materials are stacked can be avoided. Moreover, since the technique can complete the manufacture of a semiconductor light-emitting device on one substrate and devices do not need to be transferred, the known issue of poor reliability caused by the transfer of devices can be avoided. Therefore, the semiconductor light-emitting device of the embodiments of the invention can have both good reliability and CRI.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
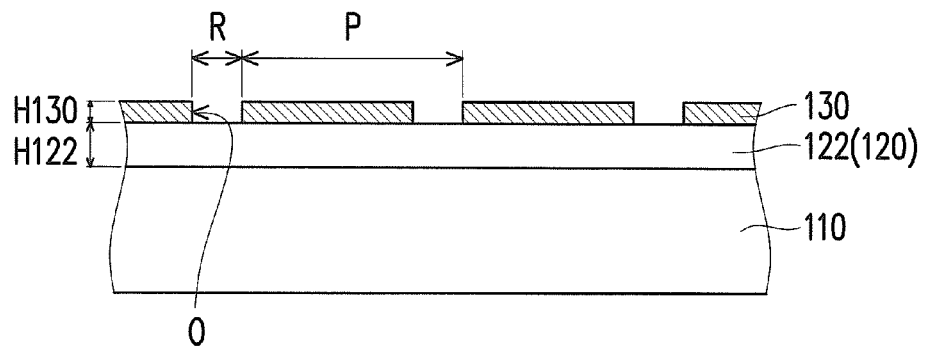
FIG. 1A to FIG. 1F are cross-sectional schematic diagrams of a manufacturing process of a semiconductor light-emitting device according to the first embodiment of the invention.

FIG. 1A to FIG. 1F are cross-sectional schematic diagrams of a manufacturing process of a semiconductor light-emitting device according to the first embodiment of the invention. Referring first to FIG. 1A, a base 122 and an insulation layer 130 are formed on a substrate 110 in sequence, wherein the insulation layer 130 includes a plurality of openings O and the openings O expose the base 122.

The substrate 110 can be a sapphire substrate (aluminium oxide, $Al_2O_3$), a silicon carbide (SiC) substrate, a silicon (Si) substrate, a gallium arsenide (GaAs) substrate, a gallium phosphide (GaP) substrate, a gallium nitride (GaN) substrate, an aluminum gallium nitride (GaAlN) substrate, a zinc oxide (ZnO) substrate, a magnesium zinc oxide (ZnMgO) substrate, a lithium aluminate ($LiAlO_2$) substrate, a lithium gallate ($LiGaO_2$) substrate, or other substrates suitable for epitaxy. In the present embodiment, the substrate 110 is exemplified by a c-plane sapphire substrate. The c-plane refers to the {0001} lattice plane.

A thickness H122 of the base 122 is, for instance, between 0 μm and 3 μm, and the material of the base 122 is, for instance, a first-type doped semiconductor material such as N-type gallium nitride. However, the invention does not limit the thickness H122 and the material of the base 122. Moreover, the method of forming the base 122 includes, for instance, a metal-organic chemical vapor deposition (MOCVD) method, but the invention is not limited thereto. In other embodiments, the method of forming the base 122 can also include a method such as molecular beam epitaxy (MBE), sputtering, evaporation, pulsed laser deposition (PLD), vapor phase epitaxy (VPE) or liquid phase epitaxy (LPE), atomic layer deposition (ALD), or chemical vapor deposition (CVD), etc. Moreover, before forming the base 122, a suitable buffer layer can optionally be grown according to the material of the substrate 110 to improve the epitaxy quality of a subsequent film layer.

A thickness H130 of the insulation layer 130 is, for instance, between 10 nm and 100 nm, and the material thereof can be an inorganic material. The inorganic material is, for instance, silicon oxide, silicon nitride, silicon oxynitride, silicon aluminum oxide, or a stacked layer of at least two of the materials above. Moreover, the method of forming the insulation layer 130 includes, for instance, depositing an entire surface of an inorganic material with a plasma-enhanced chemical vapor deposition (PECVD) method, and then forming openings O with nanoimprint lithography and a reactive ion etching (RIE) method. However, the invention does not limit the method of &inning the openings O. In other embodiments, the method of forming the openings O can also include a photochemical method.

Viewing from the direction perpendicular to the base 122, the shape of each opening O is, for instance, a circle, a diameter R of each opening O is between 50 nm and 1000 nm, and a pitch P of two adjacent openings O is between 100 nm and 3000 nm. In the present embodiment, each opening O maintains an equal pitch P with six adjacent openings O. That is, the openings O are hexagonally arranged. However, the invention is not limited to the above design. The design parameters such as the diameter R, the pitch P, and the shape of each opening O or the arrangement method of the openings O can be decided according to actual design requirements.

Figure 1B:
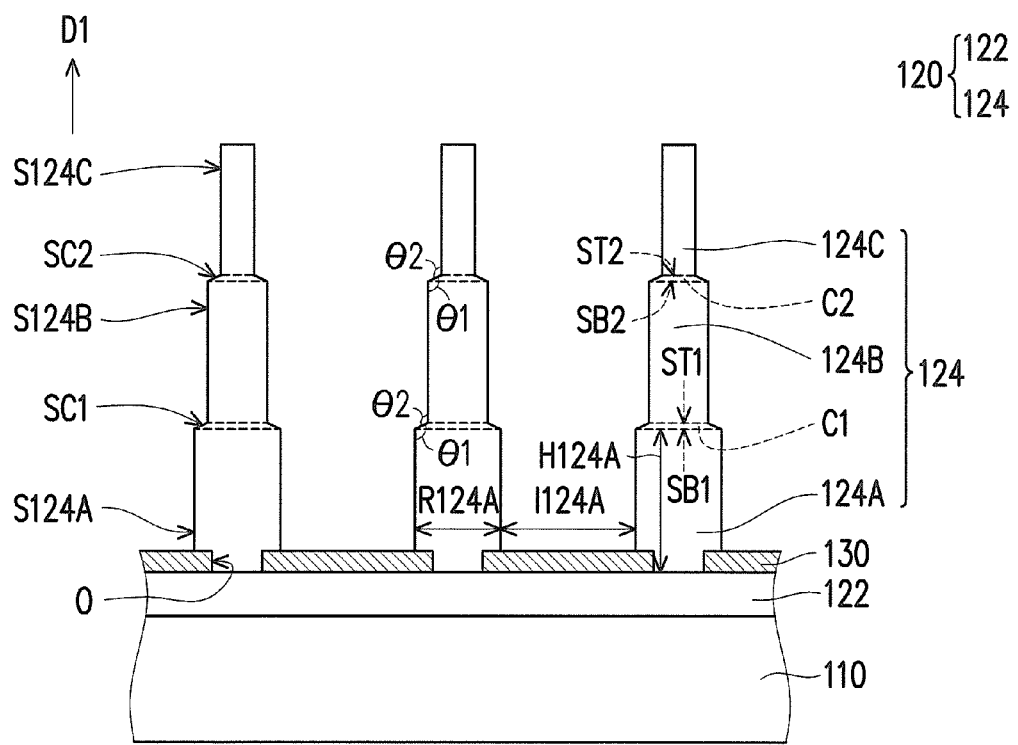

Referring to FIG. 1B, a first-type doped semiconductor material is then grown in the openings O to form a plurality of multi-section rod structures 124. In other words, the multi-section rod structures 124 and the base 122 of the present embodiment are manufactured with the same material (first-type doped semiconductor material), wherein the base 122 and the plurality of multi-section rod structures 124 extended upward from the base 122 together form a first-type doped semiconductor structure 120 of the present embodiment.

The multi-section rod structures 124 are extended outside the openings O from inside the openings O and each multi-section rod structure 124 includes a plurality of rods and at least one connecting portion. The present embodiment is described with three rods 124A, 124B, and 124C and two connecting portions C1 and C2, but the invention is not limited thereto. In other embodiments, each multi-section rod structure can include N rods and (N−1) connecting portions, wherein N is a positive integer greater than 1.

The rods 124A, 124B, and 124C are, for instance, stacked on the base 122 in sequence along a first direction D1. The first direction D1 is perpendicular to the base 122 and points to the connecting portion C1 from the base 122. In other words, the first direction D1 is the growth direction (also the c-axis direction in the present embodiment) of each multi-section rod structure 124.

The cross-section areas of the rods 124A, 124B, and 124C on a reference plane (not shown) parallel to the substrate 110 are different from one another. In the present embodiment, the cross-section area of the same rod 124A (or rods 124B and 124C) on the reference plane remains the same, and the cross-section areas of different rods 124A, 124B, and 124C on the reference plane, for instance, gradually decrease along the first direction D1. In other words, the cross-section area of the rod 124C is less than the cross-section area of the rod 124B, and the cross-section area of the rod 124B is less than the cross-section area of the rod 124A. However, the invention is not limited thereto. The cross-section area of the same rod 124A (or rods 124B and 124C) on the reference plane may vary due to different process conditions.

The connecting portions C1 and C2 are respectively located between the rod 124A and the rod 124B and between the rod 124B and the rod 124C to connect the two adjacent rods 124A and 124B and the two adjacent rods 124B and 124C along the first direction D1.

Specifically, the connecting portion C1 has a top surface ST1 and a bottom surface SB1 located between the top surface ST1 and the base 122, and the connecting portion C2 has a top surface ST2 and a bottom surface SB2 located between the top surface ST2 and the base 122. In the present embodiment, the cross-section area of the bottom surface SB1 on the reference plane is the same as the cross-section area of the rod 124A connected to the bottom surface SB1 on the reference plane, and the cross-section area of the top surface ST1 on the reference plane is the same as the cross-section area of the rod 124B connected to the top surface ST1 on the reference plane. Moreover, the cross-section area of the bottom surface SB2 on the reference plane is the same as the cross-section area of the rod 124B connected to the bottom surface SB2 on the reference plane, and the cross-section area of the top surface ST2 on the reference plane is the same as the cross-section area of the rod 124C connected to the top surface ST2 on the reference plane.

Since in the present embodiment, the cross-section area of the same rod 124A (or the rods 124B and 124C) on the reference surface remains the same, and the cross-section areas of different rods 124A, 124B, and 124C on the reference plane gradually decrease along the first direction D1, the cross-section area of the bottom surface SB1 of the connecting portion C1 on the reference plane is greater than the cross-section area of the top surface ST1 on the reference plane, the cross-section area of the top surface ST1 on the reference plane is the same as the cross-section area of the bottom surface SB2 of the connecting portion C2 on the reference plane, and the cross-section area of the bottom surface SB2 of the connecting portion C2 on the reference plane is greater than the cross-section area of the top surface ST2 on the reference plane.

Under the above design, sidewalls S124A, S124B, and S124C of the rods 124A, 124B, and 124C of the present embodiment are substantially perpendicular to the base 122, and sidewalls SC1 and SC2 of the connecting portions C1 and C2 are inclined to the base 122. Specifically, a first angle $\theta 1$ is included between the sidewall S124A of the rod 124A connected to the bottom surface SB1 of the connecting portion C1 and the sidewall SC1 of the connecting portion C1 inside the multi-section rod structures 124, and a second angle $\theta 2$ is included between the sidewall S124B of the rod 124B connected to the top surface ST1 of the connecting portion C1 and the sidewall SC1 of the connecting portion C1 outside the multi-section rod structures 124. The first angle $\theta 1$ is included between the sidewall S124B of the rod 124B connected to the bottom surface SB2 of the connecting portion C2 and the sidewall SC2 of the connecting portion C2 inside the multi-section rod structures 124, and the second angle $\theta 2$ is included between the sidewall S124C of the rod 124C connected to the top surface ST2 of the connecting portion C2 and the sidewall SC2 of the connecting portion C2 outside the multi-section rod structures 124. The first angle $\theta 1$ and the second angle $\theta 2$ are greater than 90 degrees and less than 180 degrees. In the present embodiment, the first angle $\theta 1$ and the second angle $\theta 2$ are the same. Moreover, the sidewalls S124A, S124B, and S124C of each rod 124A, 124B, and 124C are {1-100} lattice planes, and the sidewalls SC1 and SC2 of the connecting portions C1 and C2 are {1-101} lattice planes. However, the invention is not limited thereto. The sidewalls SC1 and SC2 of the connecting portions C1 and C2 can be other lattice planes according to the material of each of the substrate 110 and the first-type doped semiconductor structure 120.

The method of forming the multi-section rod structures 124 includes, for instance, a pulsed growth method. The pulsed growth method alternately supplies each element of the desired compound during the growth process of the multi-section rod structures 124. For instance, the material of the first-type doped semiconductor structure 120 includes a Group III element (such as gallium) and a Group V element (such as nitrogen). The method of forming the rods 124A, 124B, and 124C and the connecting portions C1 and C2 respectively includes performing a plurality of pulsed growth processes. The pulsed growth processes include a self-catalytic vapor-liquid-solid (VLS) growth process, and a droplet of the metal (gallium in the present embodiment) to be grown is used as a catalyst in the VLS growth process. In the following description, the material of the multi-section rod structures 124 is gallium nitride.

Figure 2:
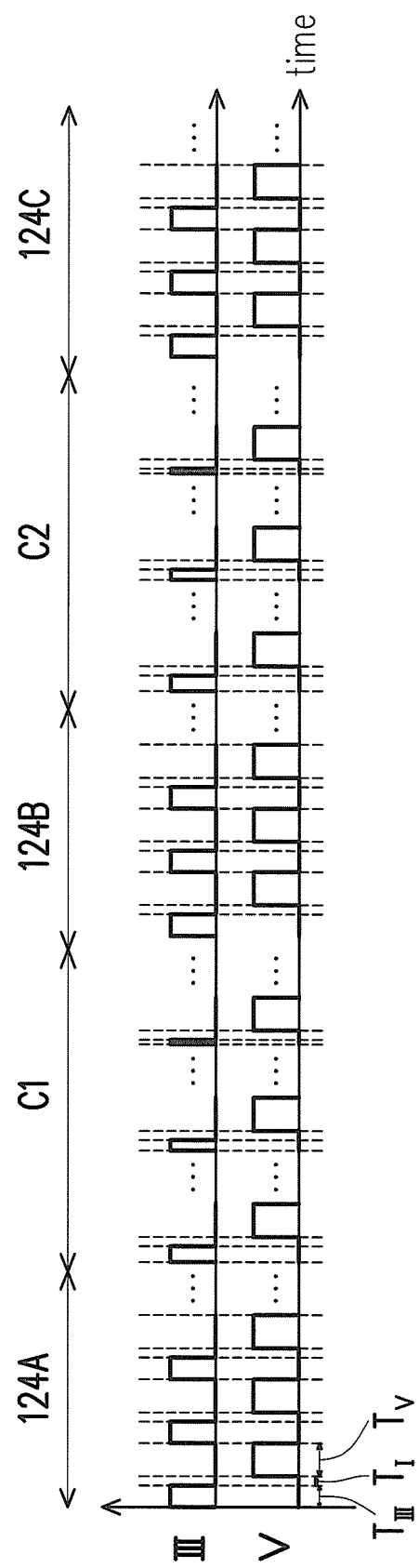
FIG. 2 is a supply timing diagram of a Group III element and a Group V element of multi-section rod structures in FIG. 1B in a pulsed growth process.

FIG. 2 is a supply timing diagram of a Group III element and a Group V element of the multi-section rod structures in FIG. 1B in a pulsed growth process. In FIG. 2, the graph in the upper row is the supply timing of the Group III element and the graph in the lower row is the supply timing of the Group V element. Referring to FIG. 1B and FIG. 2, each pulsed growth process M includes an atom source supplying the Group III element once and an atom source supplying the Group V element once. The atom source of the Group III element is, for instance, trimethylgallium (TMGa), and the atom source of the Group V element is, for instance, ammonia gas (NH3), but the invention is not limited thereto. In other embodiments, the atom source of the Group III element can also be triethylgallium (TEGa).

Before the pulsed growth processes are performed, a general growth method can be used to completely fill the openings O with gallium nitride. In the pulsed growth processes, first, the atom source of the Group III element (such as gallium) is supplied to deposit a metal droplet (under a high-temperature growth condition) on the gallium nitride completely filling the openings O. In particular, during a supply duration $T_{III}$ of the atom source of the Group III element, the atom source of the Group V element is turned off. Then, the atom source of the Group III element is turned off, and a pause duration $T_I$ is kept. Then, the atom source of the Group V element (such as a nitrogen atom source) is supplied by keeping the atom source of the Group III element in an off state. The molten metal droplet absorbs the supplied nitrogen atom, and gallium nitride is precipitated from the bottom portion of the metal droplet when a super saturation state is achieved.

After a plurality of pulsed growth processes M are performed, the rod 124A of the first-type doped semiconductor structure 120 can be formed. In the present embodiment, the rod 124A is, for instance, formed after 20 pulsed growth processes M. Moreover, during the 20 pulsed growth processes M, the supply durations $T_{III}$ of the atom source of the Group III element are, for instance, all 20 seconds (s), supply durations $T_V$ of the atom source of the Group V element are, for instance, all 30 s, and the pause durations $T_I$ are, for instance, all 0.5 s. However, those skilled in the art can modulate the number and the length of the supply durations $T_{III}$ and $T_V$ and the pause durations $T_I$ of the pulsed growth processes according to different design requirements.

By modulating the supply durations $T_{III}$ of the atom source of the Group III element, the supply durations $T_V$ of the atom source of the Group V element, and the pause durations $T_I$, a height H124A of the rod 124A can be between several hundred nm to several μm. Moreover, a spacing I124A of the rod 124A is, for instance, between 10 nm and several μm, and a diameter R124A (if the rod 124A has a hexagonal cross-section, then the diameter R124A can be defined as the distance between two parallel surfaces on the hexagonal cross-section) of the rod 124A is, for instance, between 10 nm and several μm. In particular, the diameter R124A of the rod 124A extended outside the openings O can be greater than or equal to the diameter R of the openings O. More specifically, during the growth processes of the rod 124A, the shape, the diameter R124A, and the spacing I124A of the rod 124A vary according to changes in the process parameters. The process parameters here can include, for instance, the pressure and the temperature of crystal growth, the elemental composition of the rod 124A, the shape of the openings O, the diameter R of the openings O, and the spacing P of the openings O. Therefore, the invention does not limit the shape of the cross-section area of the rod 124A. In an embodiment, the shape of the cross-section area of the rod 124A can be, for instance, a polygon, an ellipse, or a circle.

The connecting portion C1 is subsequently manufactured after the rod 124A, wherein the connecting portion C1 is also formed by performing a plurality of pulsed growth processes M. In the present embodiment, the connecting portion C1 is, for instance, formed after 9 pulsed growth processes M. Moreover, during the 9 pulsed growth processes, all of the supply durations $T_{III}$ of the atom source of the Group III element are less than the supply durations $T_{III}$ of the atom source of the Group III element in all of the pulsed growth processes M forming the rod 124A. Moreover, in the 9 pulsed growth processes, the supply durations $T_{III}$ of the atom source of the Group III element include a gradual decrease. Specifically, during the 9 pulsed growth processes, the supply durations $T_V$ of the atom source of the Group V element are, for instance, all 30 s, and the pause durations $T_I$ are, for instance, all 0.5 s. However, the atom source of the Group III element is, for instance, sequentially 15 s supplied three times, 10 s supplied three times, and 5 s supplied three times. However, those skilled in the art can modulate the number and the length of the supply durations $T_{III}$ and $T_V$ and the pause durations $T_I$ of the pulsed growth processes according to different design requirements.

In the present embodiment, the supply durations $T_{III}$ of the atom source of the Group III element, for instance, gradually decrease such that the cross-section area of the connecting portion C1 on the reference plane gradually decreases toward the first direction D1. However, in another embodiment, the cross-section area of the connecting portion C1 can also be controlled by modulating the supply durations $T_V$ of the atom source of the Group V element. By repeating the steps above (the supply durations $T_{III}$ are all 20 s, the supply durations $T_{III}$ gradually decrease to 5 s from 15 s, and the supply durations $T_{III}$ are all 20 s), the rod 124B, the connecting portion C2, and the rod 124C can be formed in sequence.

Figure 1C:
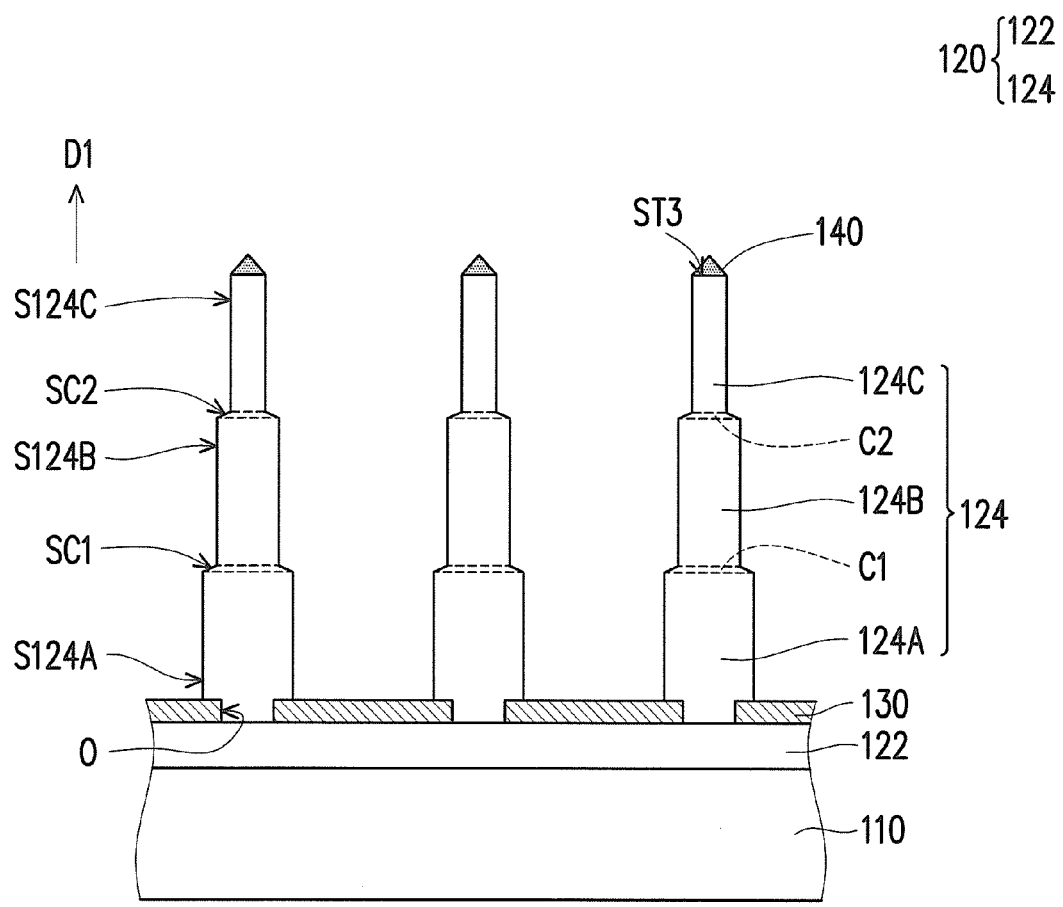

Referring to FIG. 1C, in the present embodiment, after the manufacture of the first-type doped semiconductor structure 120 is complete and before the light-emitting layer is formed, a current suppressing structure 140 can be optionally formed on a top surface ST3 of the rod 124C farthest from the substrate 110 in at least one multi-section rod structure 124. FIG. 1C illustrates that the current suppressing structure 140 is formed on all of the multi-section rod structures 124, but the invention is not limited thereto.

The current suppressing structure 140 includes, for instance, an undoped semiconductor layer. The undoped semiconductor layer can be an undoped aluminum gallium nitride layer or an undoped gallium nitride layer. Alternatively, the current suppressing structure 140 can also be a stacked layer of an undoped aluminum gallium nitride layer and an undoped gallium nitride layer. In the present embodiment, the shape of the current suppressing structure 140 is, for instance, a pyramid shape, and the current suppressing structure 140 protrudes toward the first direction D1 from the top surface ST3 of the rod 124C. By forming the current suppressing structure 140 on the top surface ST3 of the rod 124C, the resistance of the top surface ST3 of the rod 124C can be increased such that most of the injection current flows to the sidewalls S124A, S124B, and S124C of the rods 124A, 124B, and 124C.

Figure 1D:
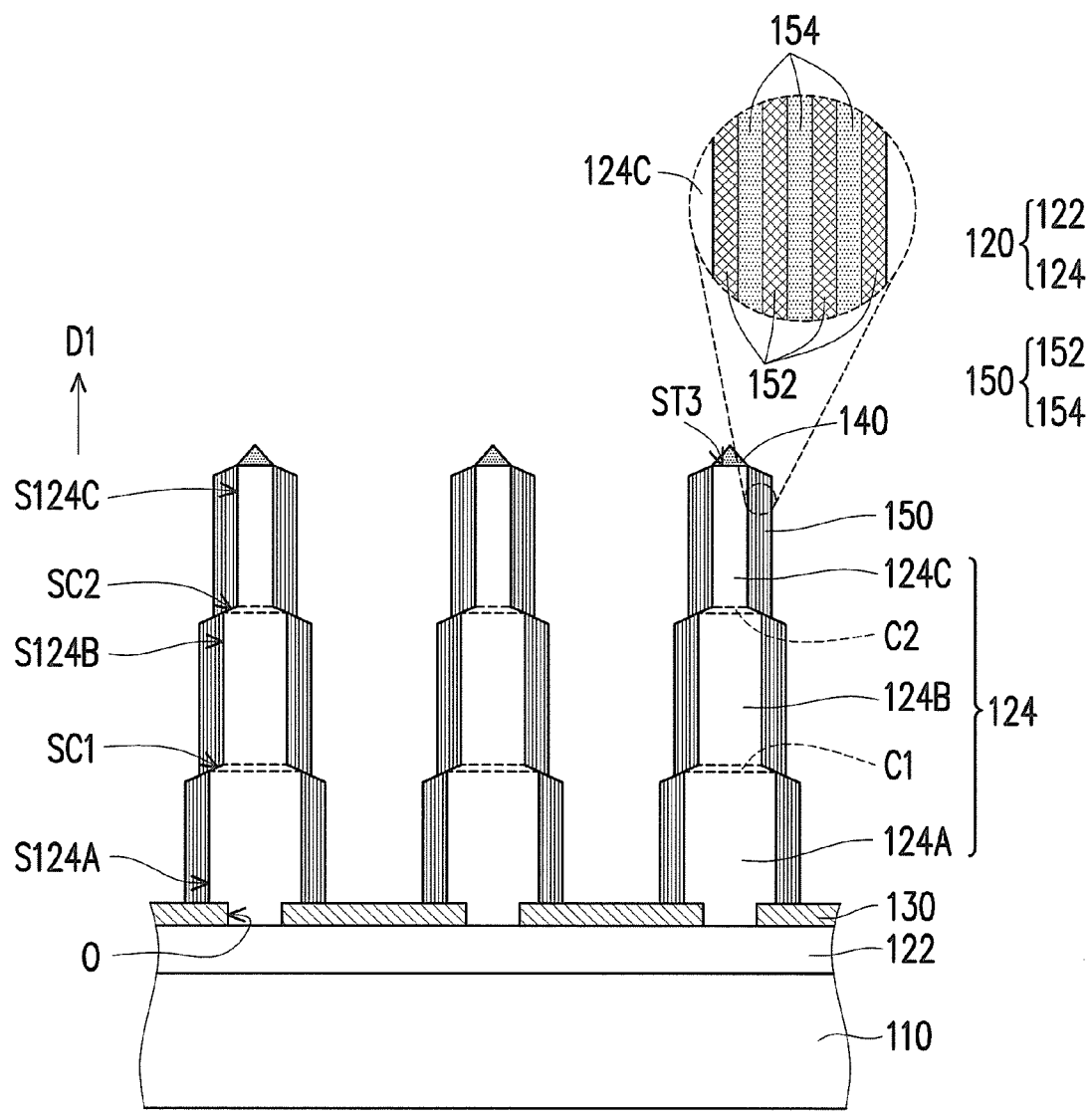

Referring to FIG. 1D, a light-emitting layer 150 is formed on the sidewalls S124A, S124B, and S124C of the rods 124A, 124B, and 124C. The method of forming the light-emitting layer 150 can include, for instance, MOCVD, MBE, ALD, PLD, or CVD.

The light-emitting layer 150 can be a quantum well layer or a multiple quantum well (MQW) layer. In the present embodiment, a multiple quantum well layer is used for description. More specifically, the light-emitting layer 150 can include a plurality of quantum barrier layers 152 and a plurality of quantum well layers 154, wherein the quantum barrier layers 152 and the quantum well layers 154 are alternately stacked on the sidewalls S124A, S124B, and S124C. In the present embodiment, the light-emitting layer 150 is described with three cycles of the quantum barrier layers 152 and the quantum well layers 154, the material of the quantum barrier layers 152 is, for instance, gallium nitride (GaN), and the material of the quantum well layers 154 is, for instance, indium gallium nitride (InGaN). However, the invention is not limited thereto. In other embodiments, the chemical formula of each of the quantum well layers 154 and the quantum barrier layers 152 can respectively be $In_xGa_yAl_{1-x-y}N$ and $Ga_zAl_{1-z}N$, wherein x, y, and z represent the mole fractions of the elements, and x, y, and z are between 0 and 1. Alternatively, the chemical formula of each of the quantum well layers 154 and the quantum barrier layers 152 can respectively be $Cd_xZn_yMg_{1-x-y}O$ and $Zn_zMg_{1-z}O$, wherein x, y, and z are between 0 and 1. Those skilled in the art can make the semiconductor light-emitting device emit light of different wave bands by modulating the contents (such as the contents of indium and gallium, the contents of indium, gallium, and aluminium, or the contents of cadmium, zinc, and magnesium above) of the elemental composition of each of the quantum barrier layers 152 and the quantum well layers 154 in the light-emitting layer 150.

In the present embodiment, before forming the light-emitting layer 150, the pyramid-shaped current suppressing structure 140 has been formed on the top surface ST3 of the rod 124C. The forming rate of the material of the light-emitting layer 150 on the pyramid-shaped current suppressing structure 140 is far less than the forming rate of the material of the light-emitting layer 150 on the sidewalls S124A, S124B, and S124C of the rods 124A, 124B, and 124C. As a result, in the present embodiment, the material of most of the light-emitting layer 150 can be formed on the sidewalls S124A, S124B, and S124C of the rods 124A, 124B, and 124C. That is, the material of most of the light-emitting layer 150 is formed on the {1-100} lattice plane (non-polar plane), thereby forming a non-polar light-emitting layer 150. In this way, the non-polar light-emitting layer 150 on the sidewalls S124A, S124B, and S124C of the rods 124A, 124B, and 124C can sufficiently achieve the light-emitting effect thereof. Moreover, since the non-polar light-emitting layer 150 achieves the efficacy of lessening the quantum-confined Stark effect, a semiconductor light-emitting device having good light-emitting efficiency is manufactured.

In comparison to prior art in which the light-emitting layer is formed on a two-dimensional first-type doped semiconductor layer, that is, the contact surface of the light-emitting layer and the first-type doped semiconductor layer is a plane parallel to the substrate, the light-emitting layer 150 of the present embodiment is formed on the sidewall of a three-dimensional first-type doped semiconductor structure 120. Therefore, the surface area of the light-emitting layer 150 of the present embodiment is greater. In other words, in comparison to prior art, the semiconductor light-emitting device of the present embodiment can have a greater effective light-emitting region.

When the device disposition surface of the substrate 110 is a c-plane and voltage is applied to the semiconductor light-emitting device, the generation of a polarization field readily causes quantum-confined Stark effect in the quantum wells, and the effect reduces the light-emitting efficiency of the semiconductor light-emitting device. In general, to lessen the quantum-confined Stark effect, the prior art substitutes the c-plane (polar plane) substrate with a non-polar or semi-polar substrate to grow each film layer of the semiconductor light-emitting device. However, it is either difficult to grow a high crystal quality light-emitting device with a non-polar or semi-polar substrate, or the manufacturing costs are very high. In comparison, in the present embodiment, the non-polar light-emitting layer 150 can be manufactured by forming the multi-section rod structures 124 and forming the light-emitting layer 150 on the sidewalls S124A, S124B, and S124C of the rods 124A, 124B, and 124C of the multi-section rod structures 124. Therefore, in the present embodiment, the efficacy of lessening the quantum-confined Stark effect can be achieved without growing each film layer of the semiconductor light-emitting device on a non-polar or semi-polar substrate. More specifically, in the present embodiment, the influence of the built-in electric field in the quantum wells on the semiconductor light-emitting device can be lowered. As a result, the bending of energy band can be lessened, the overlap of the wave functions of an electron and an electron hole can be enhanced, and internal quantum efficiency can be improved, and therefore a semiconductor light-emitting device having good light-emitting efficiency can be manufactured.

Moreover, since the cross-section areas of the rods 124A, 124B, and 124C are different, the three rods release stress at different levels. As a result, the material compositions of the quantum wells of the light-emitting layer 150 formed on the sidewalls S124A, S124B, and S124C of the rods 124A, 124B, and 124C are also different. More specifically, the cross-section areas of the rods 124A, 124B, and 124C gradually decrease toward the first direction D1, thus causing the levels of stress release of the rods 124A, 124B, and 124C to increase toward the first direction D1. As a result, the indium concentration in the InGaN quantum wells of the light-emitting layer 150 formed on the sidewalls S124A, S124B, and S124C of the rods 124A, 124B, and 124C increases toward the first direction D1. In other words, the indium concentration of the light-emitting layer 150 located on the sidewall S124C is greater than the indium concentration of the light-emitting layer 150 located on the sidewall S124B, and the indium concentration of the light-emitting layer 150 located on the sidewall S124B is greater than the indium concentration of the light-emitting layer 150 located on the sidewall S124A. Therefore, after injection current is applied to the semiconductor light-emitting device, the wavelength of the light emitted by the light-emitting layer 150 located on the sidewall S124A of the rod 124A is less than the wavelength of the light emitted by the light-emitting layer 150 located on the sidewall S124B of the rod 124B. Moreover, the wavelength of the light emitted by the light-emitting layer 150 located on the sidewall S124B of the rod 124B is less than the wavelength of the light emitted by the light-emitting layer 150 located on the sidewall S124C of the rod 124C.

In other words, in the present embodiment, the semiconductor light-emitting device can emit a light beam of a plurality of wave bands by modulating the cross-section areas of the rods 124A, 124B, and 124C. As a result, the semiconductor light-emitting device can have good CRI. Moreover, in the present embodiment, since the cross-section areas of the rods 124A, 124B, and 124C are different, three light-emitting layers 150 of different indium concentrations and the same material can be formed in the same process to obtain different light colors. In other words, different light colors do not need to be obtained by stacking different materials. Therefore, the material selection of the light-emitting layer 150 of the present embodiment is simpler, and the known issue of cracks and defects caused by different lattice constants when a plurality of materials are stacked can be avoided. Moreover, since in the present embodiment, the manufacture of a semiconductor light-emitting device can be completed on one substrate and devices do not need to be transferred, the known issue of poor reliability caused by the transfer of devices can be avoided.

Figure 1E:
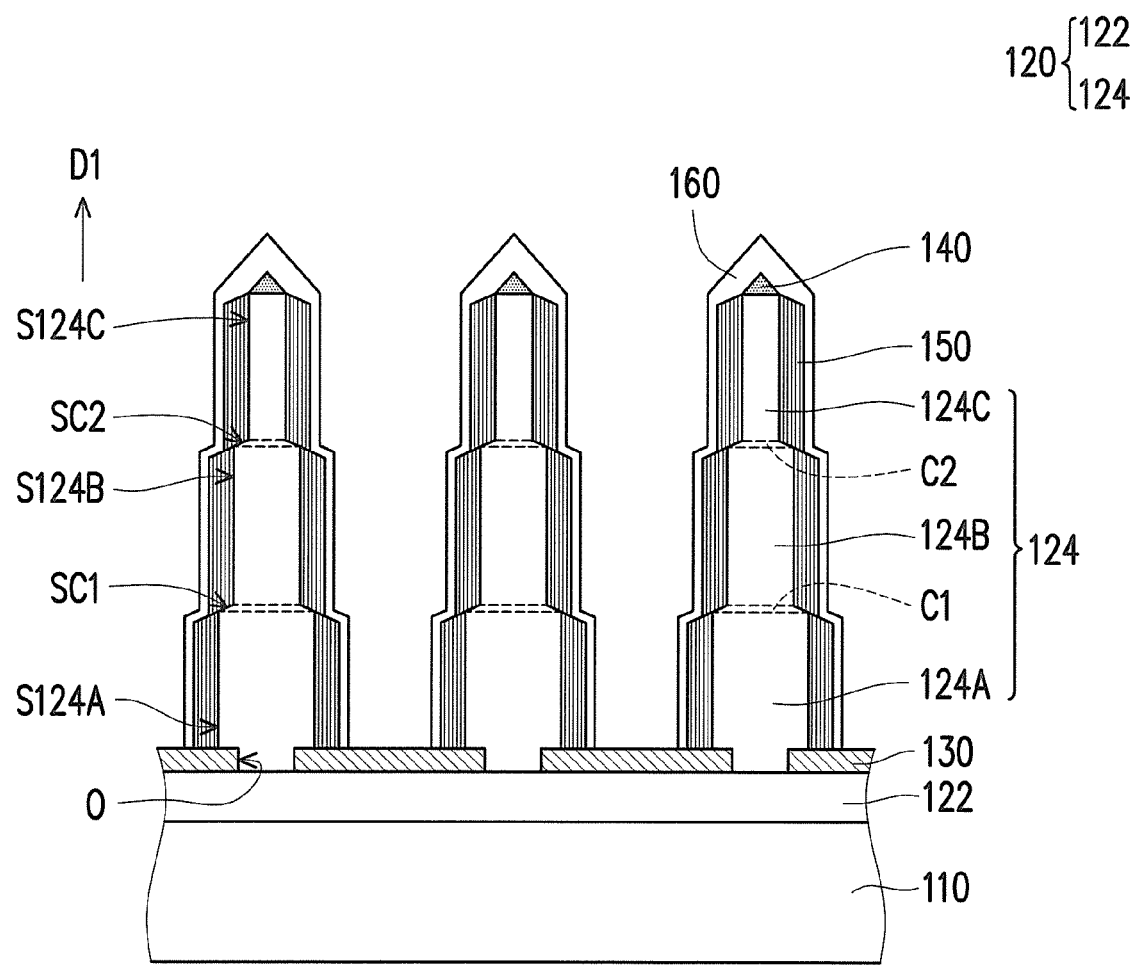

Referring to FIG. 1E, a second-type doped semiconductor layer 160 is formed on the light-emitting layer 150. In the present embodiment, the second-type doped semiconductor layer 160 further covers the current suppressing structure 140. In other words, the second-type doped semiconductor layer 160 is, for instance, substantially conformally formed on the light-emitting layer 150 and the current suppressing structure 140. The material of the second-type doped semiconductor layer 160 is, for instance, P-type gallium nitride, but the invention is not limited thereto. In another embodiment, the first-type can also be P-type, and the second-type can be N-type. Moreover, the method of forming the second-type doped semiconductor layer 160 can include, for instance, MOCVD, MBE, ALD, PLD, or CVD.

Figure 1F:
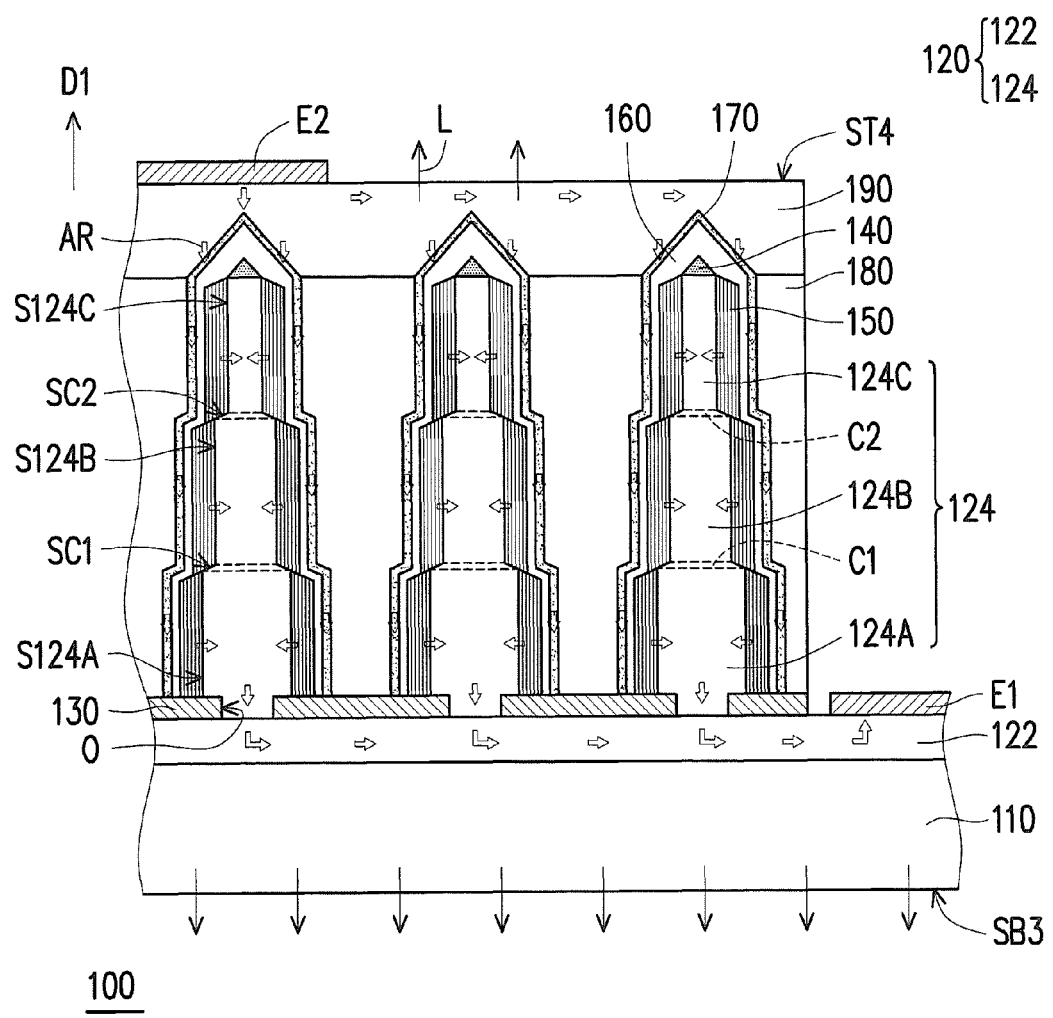

Referring to FIG. 1F, a first conductive layer 170 is formed on the second-type doped semiconductor layer 160. Then, a dielectric layer 180 is formed between the multi-section rod structures 124. Moreover, a second conductive layer 190 is formed on the dielectric layer 180 and the first conductive layer 170. Lastly, a first electrode E1 and a second electrode E2 are respectively formed on the base 122 and the second conductive layer 190. At this point, the semiconductor light-emitting device 100 of the present embodiment is preliminarily completed.

The first conductive layer 170 is, for instance, substantially conformally formed on the second-type doped semiconductor layer 160. In the present embodiment, the thickness of the first conductive layer 170 is, for instance, 50 nm, and the material of the first conductive layer 170 is, for instance, gallium zinc oxide (GaZnO), but the invention is not limited thereto. In other embodiments, the material of the first conductive layer 530 can also be other suitable transparent conductive materials, and the transparent conductive materials can include indium tin oxide, indium zinc oxide, aluminium tin oxide, aluminium zinc oxide, indium germanium zinc oxide, other suitable transparent conductors, or a stacked layer of at least two of the above. Moreover, the method of forming the first conductive layer 170 includes, for instance, MBE, MOCVD, ALD, PLD, or CVD.

By comprehensively covering the first conductive layer 170 on the second-type doped semiconductor layer 160, the injection current can be spread to the sidewalls S124A, S124B, and S124C of the rods 124A, 124B, and 124C. Therefore, the non-polar light-emitting layer 150 on the sidewalls S124A, S124B, and S124C of the rods 124A, 124B, and 124C sufficiently achieves the light-emitting effect thereof. Moreover, since the non-polar light-emitting layer 150 achieves the efficacy of lessening the quantum-confined Stark effect, a semiconductor light-emitting device having good light-emitting efficiency is manufactured.

The dielectric layer 180 is located between the multi-section rod structures 124 and the dielectric layer 180 at least covers the light-emitting layer 150 located on the sidewalls S124A, S124B, and S124C of the rods 124A, 124B, and 124C. In the present embodiment, the dielectric layer 180 exposes the current suppressing structure 140 and the second-type doped semiconductor layer 160 and the first conductive layer 170 located on the current suppressing structure 140. The material of the dielectric layer 180 can be spin-on-glass (SOG), poly(methyl methacrylate) (PMMA), polyimide, a polymer, a transparent photoresist, or other suitable materials. Moreover, the method of forming the dielectric layer 180 includes, for instance, a method such as spin coating and solidifying a liquid dielectric layer, electron beam evaporation, sputtering, ALD, or CVD. However, the invention is not limited thereto.

At least one of a plurality of quantum dots, a plurality of fluorescent powders, and a plurality of metal nanoparticles not shown can be further added in the dielectric layer 180. The quantum dots can be elemental or core-shell semiconductor nanoparticles, and the material thereof is, for instance, zinc selenide (ZnSe), zinc sulfide (ZnS), cadmium selenide (CdSe), cadmium sulfide (CdS), lead selenide (PbSe), lead sulfide (PbS), or a combination of two of the above. Moreover, the metal nanoparticles can be elemental or core-shell metal nanoparticles, and the material thereof is, for instance, silver, gold, a combination of silver and silicon oxide, or a combination of gold and silicon oxide.

Since the quantum dots and the fluorescent powders can absorb the short wavelength light beam emitted by the light-emitting layer 150 and release a long wavelength light beam, by adding at least one of the quantum dots and the fluorescent powders in the dielectric layer 180, the CRI of the semiconductor light-emitting device 100 can be further improved such that the semiconductor light-emitting device 100 can emit more light colors of different wave bands and such that the light colors can be mixed into white light or the desired color light. Moreover, since the surface plasmon coupling effect of the metal nanoparticles can improve the internal quantum efficiency and the light extraction rate of the semiconductor light-emitting device 100, in the present embodiment, metal nanoparticles can be added in the dielectric layer 180 to effectively improve the light-emitting efficiency of the semiconductor light-emitting device 100.

The second conductive layer 190 covers the dielectric layer 180 and the first conductive layer 170 exposed by the dielectric layer 180. In the present embodiment, the material of the second conductive layer 190 can be selected from the material of the first conductive layer 170. Moreover, the method of forming the second conductive layer 190 can include, for instance, MBE, MOCVD, ALD, PLD, CVD, electron beam evaporation, or sputtering.

The first electrode E1 is, for instance, disposed on a device disposition surface of the base 122 of the first-type doped semiconductor structure 120. That is, the first electrode E1 and the insulation layer 130 are located on the same surface of the base 122. The second electrode E2 is, for instance, disposed on the second conductive layer 190.

In the present embodiment, the material of each of the substrate 110 and the second conductive layer 190 can be a transparent material. Therefore, the semiconductor light-emitting device 100 can be a semiconductor light-emitting device capable of emitting light in both the upper and lower sides thereof. The transparent material here refers to a conventional material having high transmittance, and is not limited to a material having 100% transmittance. More specifically, when voltage is applied to the semiconductor light-emitting device 100, the injection current flows along the direction indicated by a white arrow AR shown in FIG. 1F. That is, the injection current flows from the second electrode E2 to the sidewalls S124A, S124B, S124C of the rods 124A, 124B, and 124C along the first conductive layer 170, then flows through the second-type doped semiconductor layer 160, the light-emitting layer 150, and the rods 124A, 124B, and 124C in sequence, and then flows to the first electrode E1. When the injection current flows through the light-emitting layer 150, the light-emitting layer 150 emits a light beam L. The light beam L can be emitted from a top surface ST4 of the second conductive layer 190 or be emitted from a smooth bottom surface SB3 of the substrate 110.

In the present embodiment, through the deposition of at least one of the quantum dots, the fluorescent powders, and the metal nanoparticles in the dielectric layer 180, the light beam L emitted by the light-emitting layer 150 may hit at least one of the quantum dots, the fluorescent powders, and the metal nanoparticles in the dielectric layer 180, thereby achieving at least one of the efficacies above, such as improving the CRI, the internal quantum efficiency, the light extraction efficiency, or the overall light-emitting efficiency of the semiconductor light-emitting device 100.

Moreover, through the deposition of the current suppressing structure 140, most of the injection current flows to the sidewalls S124A, S124B, and S124C of the rods 124A, 124B, and 124C, such that the non-polar light-emitting layer 150 on the sidewalls S124A, S124B, and S124C sufficiently achieves the efficacy of lessening the quantum-confined Stark effect. Therefore, the semiconductor light-emitting device 100 of the present embodiment can have good light-emitting efficiency.

Figure 3:
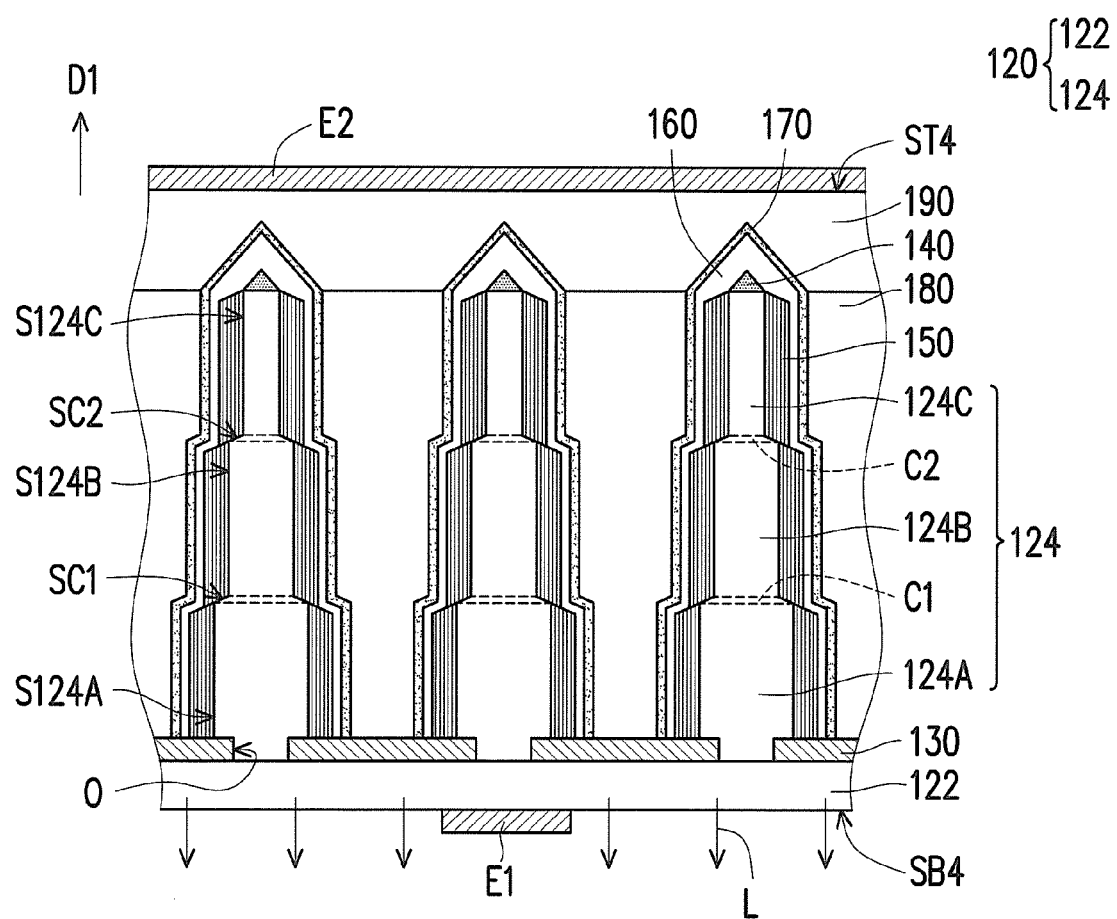
FIG. 3 is a cross-sectional schematic diagram of a semiconductor light-emitting device according to the second embodiment of the invention.

The disposition location of each of the first electrode E1 and the second electrode E2 is only exemplary, and the invention is not limited thereto. FIG. 3 is a cross-sectional schematic diagram of a semiconductor light-emitting device according to the second embodiment of the invention. Referring to FIG. 3, a semiconductor light-emitting device 200 of the present embodiment has a similar structure to the semiconductor light-emitting device 100 of FIG. 1F. The main difference between the two is the disposition location of each of the first electrode E1 and the second electrode E2 of the semiconductor light-emitting device 200. More specifically, the second electrode E2 of the present embodiment comprehensively covers the top surface ST4 of the second conductive layer 190, and the first electrode E1 is disposed on the bottom surface SB4 of the base 122 of the first-type doped semiconductor structure 120, wherein the bottom surface SB4 is the surface away from the insulation layer 130.

In the present embodiment, the method of forming the first electrode E1 includes, for instance, removing the substrate 110 before forming the first electrode E1 so as to form the first electrode E1 on the bottom surface SB4 of the base 122 opposite to the rods 124A, 124B, and 124C. Since the second electrode E2 is a metal electrode, the material thereof is a less transparent material. Therefore, the semiconductor light-emitting device 200 of the present embodiment is a semiconductor light-emitting device emitting light from one side. That is, the light beam L is emitted from the surface SB4.

Figure 4:
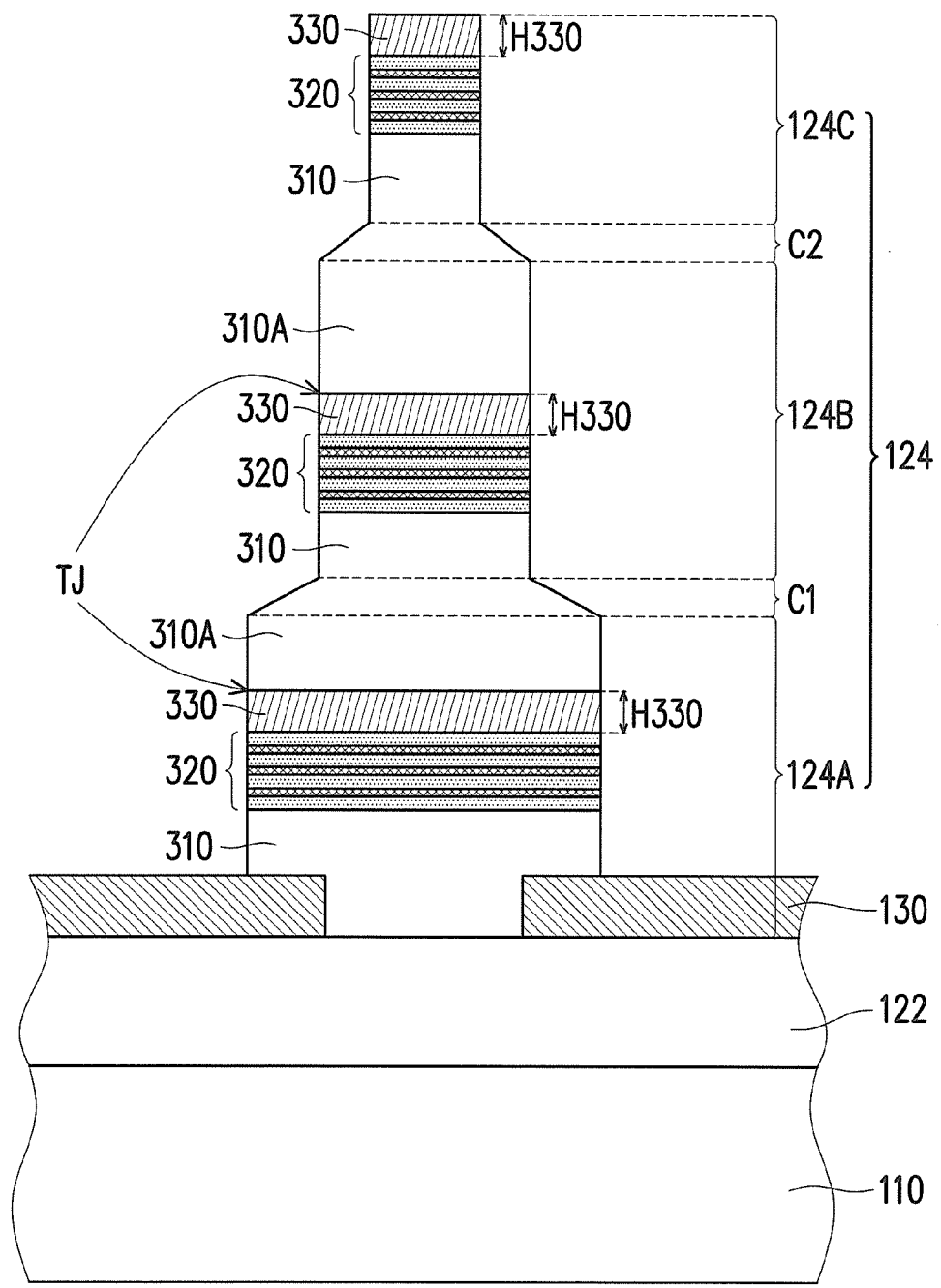
FIG. 4 is a cross-sectional schematic diagram of a semiconductor light-emitting device according to the third embodiment of the invention.

FIG. 4 is a cross-sectional schematic diagram of a semiconductor light-emitting device according to the third embodiment of the invention. Referring to FIG. 4, the contour of a semiconductor light-emitting device 300 of the present embodiment is substantially the same as in FIG. 1D, and the main difference is, the light-emitting layer of the present embodiment is manufactured in each rod. As a result, the light-emitting layer is disposed parallel to the base 122 and the shape of the light-emitting layer is disc-like. Moreover, in addition to the first-type doped semiconductor material, the material of the multi-section rod structures 124 also includes other materials.

Specifically, each rod 124A, 124B, and 124C includes at least one first-type doped semiconductor layer 310, a light-emitting layer 320, and a second-type doped semiconductor layer 330, wherein the light-emitting layer 320 is located between the first-type doped semiconductor layer 310 and the second-type doped semiconductor layer 330. In the present embodiment, the first-type doped semiconductor layer 310, the light-emitting layer 320, and the second-type doped semiconductor layer 330 are alternately stacked on the base 122. Moreover, a thickness H330 of each second-type doped semiconductor layer 330 ranges from, for instance, 50 nm to 200 nm.

Moreover, the material of the base 122 and the material of each of the connecting portions C1 and C2 are the same as the material of the first-type doped semiconductor layer 310, and the rods (i.e., rods 124A and 124B) other than the rod 124C farthest from the base 122, for instance, further have another first-type doped semiconductor layer 310A connected between the second-type doped semiconductor layer 330 and the connecting portion C1 (or the connecting portion C2). For instance, the material of each of the base 122, the first-type doped semiconductor layers 310 and 310A and the connecting portions C1 and C2 is N-type gallium nitride, and the material of the second-type doped semiconductor layer 330 is P-type gallium nitride, but the invention is not limited thereto. It can be known from the above content that, the multi-section rod structures 124 of the present embodiment are, for instance, formed by a plurality of light-emitting diodes connected to one another in series, wherein in the rods 124A and 124B, the connection junction of the first-type doped semiconductor layer 310A and the second-type doped semiconductor layer 330 is a tunneling junction TJ, and an electron and an electron hole are transferred at the tunneling junction TJ through a tunneling effect.

It should be mentioned that, the material of the light-emitting layer 320 of each rod 124A, 124B, and 124C is the same (as described for FIG. 1D), and the three are only different in that the material compositions of the quantum wells are different (such as different indium concentrations). Specifically, since cross-section areas of the rods 124A, 124B, and 124C are different, even if the same materials and process conditions are used to manufacture the light-emitting layer 320 of each rod 124A, 124B, and 124C, the composition of the light-emitting layer 320 formed on each rod 124A, 124B, and 124C is still different. Therefore, in the present embodiment, light-emitting layers 320 having the same material but different compositions can also be obtained by changing the cross-section area of each rod 124A, 124B, and 124C, such that the semiconductor light-emitting device 300 can emit light colors of different wave bands, thereby having good CRI. If different but suitable process conditions are used to grow the light-emitting layer 320 of each rod 124A, 124B, and 124C, then the composition variation, the light color difference, and the CRI of the devices of the light-emitting layer 320 of each rod 124A, 124B, and 124C can be greater. In other words, in the present embodiment, different light colors can be obtained without stacking different materials, and therefore the known issue of cracks and defects caused by different lattice constants when a plurality of materials are stacked can be avoided. Moreover, since in the present embodiment, the manufacture of a semiconductor light-emitting device can be completed on one substrate and devices do not need to be transferred, the known issue of poor reliability caused by the transfer of devices can be avoided. Therefore, the semiconductor light-emitting device 300 of the present embodiment can have both good reliability and CRI.

Although FIG. 4 only illustrates one multi-section rod structure 124, in the actual manufacture, a plurality of multi-section rod structures 124 can be formed on the base 122 at the same time. Moreover, after the step of FIG. 4 is complete, the dielectric layer 180 of FIG. 1F doped with at least one of the quantum dots, the fluorescent powders, and the metal nanoparticles can be formed between the multi-section rod structures 124 to improve the CRI, the internal quantum efficiency, the light extraction rate, or the overall light-emitting efficiency of the semiconductor light-emitting device 300.

Based on the above, in the manufacturing method of a semiconductor light-emitting device of the embodiments above of the invention, the light-emitting layer is formed on the multi-section rod structures. Since the quantum well composition of the light-emitting layer formed on different rods vary with changes in the cross-section areas of the rods, the light-emitting layer corresponding to different rods can emit light colors of different wave bands. Therefore, by modulating the cross-section area of each rod, the semiconductor light-emitting device of the embodiments of the invention can have good CRI. Moreover, since in the embodiments of the invention, different light colors can be obtained by changing the cross-section areas of the rods and different light colors do not need to be obtained by stacking different materials, the known issue of cracks and defects caused by different lattice constants when a plurality of materials are stacked can be avoided. Furthermore, since the technique can complete the manufacture of a semiconductor light-emitting device on one substrate and devices do not need to be transferred, the known issue of poor reliability caused by the transfer of devices can be avoided. Therefore, the semiconductor light-emitting device of the embodiments of the invention can have both good reliability and CRI.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a semiconductor light-emitting device, comprising:
    forming a first-type doped semiconductor structure on a substrate, wherein the first-type doped semiconductor structure comprises a base and a plurality of multi-section rod structures extended upward from the base, each multi-section rod structure comprises a plurality of rods and at least one connecting portion, the connecting portion connects two adjacent rods along a first direction, the first direction is perpendicular to the base and points to the connecting portion from the base, cross-section areas of different rods on a reference surface parallel to the substrate are different, and cross-section areas of the connecting portion on the reference plane decrease along the first direction;
    forming a light-emitting layer on sidewalls of the rods; and
    forming a second-type semiconductor layer on the light-emitting layer,
    wherein a material of the first-type doped semiconductor structure comprises a Group III element and a Group V element, a method of forming the rods and the connecting portion respectively comprises performing a plurality of pulsed growth processes, each pulsed growth process comprises separately supplying an atom source of the Group III element once and supplying an atom source of the Group V element once, and
    wherein in the pulsed growth processes forming the rods, supply durations of the atom source of the Group III element are all the same, in the pulsed growth processes forming the connecting portion, the supply durations of the atom source of the Group III element are less than the supply durations of the atom source of the Group III element in the pulsed growth processes forming the rods, and in the pulsed growth processes forming the connecting portion, the supply durations of the atom source of the Group III element comprise a gradual decrease.

2. The manufacturing method of the semiconductor light-emitting device of claim 1, wherein cross-section areas of the rods on the reference plane gradually decrease along the first direction.

3. The manufacturing method of the semiconductor light-emitting device of claim 2, wherein a cross-section area of a same rod on the reference plane remains the same.

4. The manufacturing method of the semiconductor light-emitting device of claim 1, wherein the connecting portion has a top surface and a bottom surface located between the top surface and the base, a cross-section area of the bottom surface on the reference plane is the same as a cross-section area of a rod connected to the bottom surface on the reference plane, and a cross-section area of the top surface on the reference plane is the same as a cross-section area of a rod connected to the top surface on the reference plane.

5. The manufacturing method of the semiconductor light-emitting device of claim 1, wherein the connecting portion has a top surface and a bottom surface located between the top surface and the base, a first angle is included between a sidewall of a rod connected to the bottom surface and a sidewall of the connecting portion inside the multi-section rod structures, a second angle is included between a sidewall of a rod connected to the top surface and a sidewall of the connecting portion outside the multi-section rod structures, and the first angle and the second angle are greater than 90 degrees and less than 180 degrees.

6. The manufacturing method of the semiconductor light-emitting device of claim 1, wherein each multi-section rod structure comprises N rods and (N−1) connecting portions, N is a positive integer greater than 1, and each connecting portion connects two adjacent rods along the first direction.

7. The manufacturing method of the semiconductor light-emitting device of claim 6, wherein in each connecting portion and two rods connected to the connecting portion, a first angle is included between a sidewall of a rod closer to the base and a sidewall of the connecting portion inside the multi-section rod structures, a second angle is included between a sidewall of a rod farther from the base and a sidewall of the connecting portion outside the multi-section rod structures, and the first angle and the second angle are greater than 90 degrees and less than 180 degrees.

8. The manufacturing method of the semiconductor light-emitting device of claim 1, wherein a sidewall surface of each rod is a {1-100} lattice plane, and a sidewall surface of the connecting portion is a {1-101} lattice plane.

9. The manufacturing method of the semiconductor light-emitting device of claim 1, further comprising:
    forming a current suppressing structure on a top surface of a rod farthest from the substrate in at least one multi-section rod structure before forming the light-emitting layer.

10. The manufacturing method of the semiconductor light-emitting device of claim 9, wherein the current suppressing structure comprises an undoped semiconductor layer.

11. The manufacturing method of the semiconductor light-emitting device of claim 1, wherein a method of forming the first-type doped semiconductor structure comprises:
    forming the base of the first-type doped semiconductor structure and an insulation layer on the substrate in sequence, wherein the insulation layer comprises a plurality of openings, and the openings expose the base; and
    growing a material of the first-type doped semiconductor structure in the openings to form the multi-section rod structures, wherein the multi-section rod structures are extended outside the openings from inside the openings.

* * * * *